(12) United States Patent
Lee et al.

(10) Patent No.: US 6,787,460 B2
(45) Date of Patent: Sep. 7, 2004

(54) METHODS OF FORMING METAL LAYERS IN INTEGRATED CIRCUIT DEVICES USING SELECTIVE DEPOSITION ON EDGES OF RECESSES AND CONDUCTIVE CONTACTS SO FORMED

(75) Inventors: Hyo-jong Lee, Seoul (KR); Seung-man Choi, Kyungki-do (KR); Sang-bum Kang, Seoul (KR); Gil-heyun Choi, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/046,805

(22) Filed: Jan. 14, 2002

(65) Prior Publication Data

US 2003/0134510 A1 Jul. 17, 2003

(51) Int. Cl.[7] .............................................. H01L 21/44
(52) U.S. Cl. ....................... 438/672; 438/674; 438/686
(58) Field of Search ................................. 438/672, 674, 438/677, 680, 686, 687, 691

(56) References Cited

U.S. PATENT DOCUMENTS

| 4,902,533 | A | 2/1990 | White et al. ................... 427/99 |
| 4,963,511 | A | 10/1990 | Smith .......................... 437/192 |
| 5,312,773 | A | 5/1994 | Nagashima ................... 437/190 |
| 5,589,425 | A | 12/1996 | Hoshino et al. ............. 427/250 |
| 5,604,153 | A | 2/1997 | Tsubouchi et al. .......... 437/173 |
| 6,133,147 | A | 10/2000 | Rhee et al. .................. 438/677 |
| 6,245,655 | B1 | 6/2001 | Moslehi ....................... 438/612 |
| 6,432,820 | B1 * | 8/2002 | Lee et al. .................... 438/677 |
| 2002/0030210 | A1 | 3/2002 | Matsui et al. ................ 257/296 |

FOREIGN PATENT DOCUMENTS

| EP | 0831523 | 3/1998 |
| JP | 07-167340 | 4/1995 |

* cited by examiner

Primary Examiner—Ernest Karlsen
Assistant Examiner—Lisa Kilday
(74) Attorney, Agent, or Firm—Myers Bigel Sibley & Sajovec

(57) ABSTRACT

Methods of forming a metal layer in integrated circuit devices using selective electroplating in a recess are disclosed. In particular, a recess is formed in a surface of an insulating layer. The recess has a side wall inside the recess, a bottom inside the recess, and an edge at a boundary of the surface of the insulating layer and the side wall. A selective electroplating mask is formed on the side wall to provide a covered portion of the side wall and an exposed portion of the side wall. The exposed portion of the side wall can be electroplated with a metal. Related conductive contacts are also disclosed.

24 Claims, 11 Drawing Sheets

METHODS OF FORMING METAL LAYERS IN INTEGRATED CIRCUIT DEVICES USING SELECTIVE DEPOSITION ON EDGES OF RECESSES AND CONDUCTIVE CONTACTS SO FORMED

FIELD OF THE INVENTION

This invention relates to methods of forming integrated circuit devices and conductive contacts so formed in general, and more particularly, to methods of forming metal layers in integrated circuit devices and conductive contacts so formed.

BACKGROUND OF THE INVENTION

In general, electroplating can be carried out to form metal layers in integrated circuit (semiconductor) devices. In particular, since an integrated circuit device, such as an Ultra-High Speed Integrated circuit (ULSI), may operate much faster than other devices, copper (Cu) layers having relatively low resistance can be used to suppress the occurrence of ElectroMigration (EM) therein. It is known to use electroplating to form Cu wiring by patterning Cu layers. However, it may be difficult to pattern Cu using general etching methods because the copper may be prone to oxidization in air. Thus, the Cu wiring is generally formed using electroplating in combination with a damascene process.

However, the electroplating and damascene processes may promote voids in the Cu wiring. In detail, voids may occur when a contact hole, through which Cu deposited, or a trench used to form the wiring, is not completely filled or filled irregularly. The voids may result in the malfunction the electrical wiring of an integrated circuit device. Also, an electrolyte solution, which is used in the electroplating process, may remain in the void, thereby deteriorating the performance of a integrated circuit device.

Figure 1:
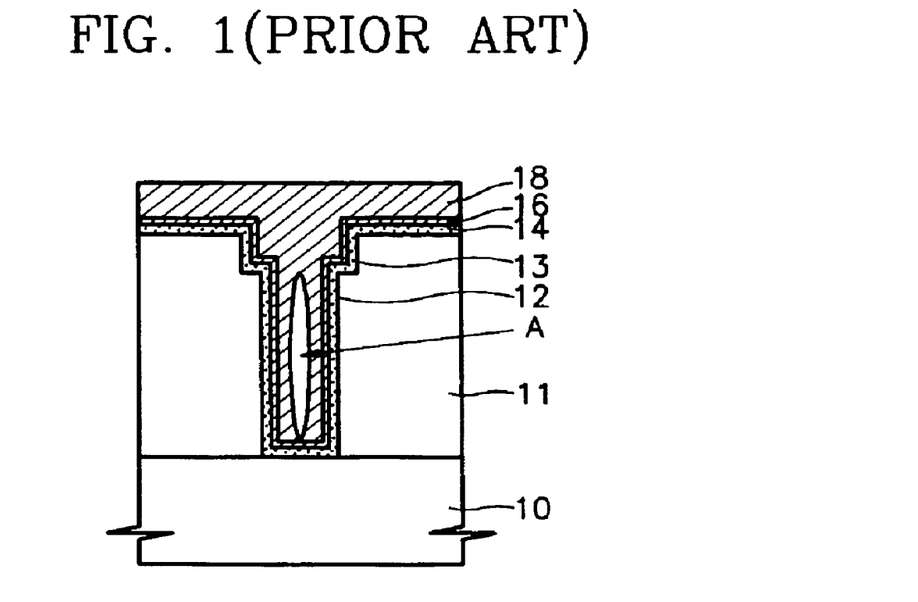
FIG. 1 is a cross-sectional view that illustrates the occurrence of voids in metal wiring layers of integrated circuit devices formed using conventional processes.

FIG. 1 is a cross-sectional view of a void A occurring in a Cu layer 18. Referring to FIG. 1, the Cu layer 18 is formed by electroplating and a damascene process to form Cu wiring in an integrated circuit device. An insulating layer 11 is formed on a integrated circuit substrate 10. Then, the insulating layer 11 is patterned according to the damascene process to form a hole 12 and a trench 13. An underlying layer, such as the integrated circuit substrate 10 or a lower conductive layer, can be electrically connected through the hole 12. Thus, the hole 12 may be a contact hole or a via that passes through the insulating layer 11. The trench 13 is formed as a line shape so as to pattern the Cu layer 18 as a wire on the insulating layer 11.

Next, a barrier metal layer 14, such as tantalum nitride (TaN), is formed on the resultant structure in which the trench 13 and the hole 12 are formed. Then, a Cu seed layer 16 is formed thereon. Thereafter, a Cu layer 18 is deposited using an electroplating process to fill the hole 12.

During the deposition of the Cu layer 18, it may be difficult to completely fill the hole 12 with the Cu layer 18 due to the high aspect ratio of the hole 12, which may contribute to the formation of the void A during the electroplating process. A reduction in the design rule of integrated circuit device can result in an increase in the aspect ratio of a hole to three or more. In other words, the hole 12 can be three times or more times deeper than it is wide. Thus, it may be more likely that the void A can occur in the hole 12 because the edges of the mouth of the hole 12 are deposited faster than other flat portions, and thus the deposition at the mouth of the hole 12 can rapidly obstruct the opening of the hole 12 before the inner portion of the hole beneath the mouth of the hole 12 is completely filled with the Cu layer 18, thereby reducing the reliability of the integrated circuit device. Moreover, an electrolyte solution used for the electroplating process may be trapped in the void A, thereby further reducing the reliability of the integrated circuit device.

SUMMARY OF THE INVENTION

Embodiments according to the invention can provide methods of forming a metal layer in integrated circuit devices using selective electroplating in a recess. Pursuant to those embodiments, a recess can be formed in a surface of an insulating layer. The recess has a side wall inside the recess, a bottom inside the recess, and an edge at a boundary of the surface of the insulating layer and the side wall. A selective electroplating mask can be formed on the side wall to provide a covered portion of the side wall and an exposed portion of the side wall that is free of the selective electroplating mask. The exposed portion of the side wall can be electroplated with a metal.

In embodiments of conductive contacts according to the invention, a conductive contact can include a recess in an integrated circuit substrate. The recess includes a side wall inside the recess, a bottom inside the recess, and an edge at a boundary of a surface of the insulating layer and the side wall. A selective electroplating mask is on the side wall to provide a covered portion of the side wall adjacent to the edge and is not on a portion of the side wall adjacent to the bottom. An electroplated metal is on the portion of the side wall adjacent to the side wall.

In further method embodiments according to the invention, a recess is etched in a surface of an insulating layer wherein the recess has a side wall inside the recess, a bottom inside the recess, and an edge at a boundary of the surface of the insulating layer and the side wall. A trench is etched in the surface of the insulating layer on the recess. The trench is wider than the recess and exposes the edge of the recess. A barrier metal layer is formed in the recess and in the trench and on the insulating layer and a seed layer is formed on the barrier metal layer. A selective electroplating mask is formed on the seed layer on the side wall adjacent to the edge to provide a covered portion of the side wall and not on the side wall beyond adjacent to the edge to provide a portion of the side wall that is not covered by the selective electroplating mask. A first metal is formed in the recess to beneath a level of the electroplating mask on the exposed portion of the side wall and not on the covered portion of the side wall. A second metal is formed in the recess and in the trench on the first metal and on the selective electroplating mask and the second metal layer is planarized to expose the selective electroplating mask.

In further method embodiments according to the invention, a first recess is etched in a surface of a first insulating layer wherein the first recess has a first side wall inside the first recess, a first bottom inside the first recess, and a first edge at a boundary of the surface of the first insulating layer and the first side wall. A first barrier metal layer is formed in the first recess and on the surface of the first insulating layer and a first seed layer is formed on the first barrier metal layer. A first selective electroplating mask is formed on the first seed layer on the first side wall adjacent to the first edge to provide a covered portion of the first side wall and not on the first side wall beyond adjacent to the first edge to provide an exposed portion of the first side wall that is free of the selective electroplating mask. A first metal is formed on the exposed portion of the first side wall in the first recess and protrudes beyond the first recess and is not formed on a portion of the first selective electroplating mask on the surface of the first insulating layer spaced apart from the first edge. The first metal is planarized to expose the first selective electroplating mask on the first edge. A second insulating layer is formed on the first metal and a surface of the second insulating layer is etched to form a second recess that exposes the first metal, wherein the second recess has a second side wall inside the second recess, a second bottom inside the second recess, and a second edge at a boundary of the surface of the second insulating layer and the second side wall. A second barrier metal layer is formed in the second recess and on the surface of the second insulating layer and a second seed layer is formed on the second barrier metal layer. A second selective electroplating mask is formed in the second recess on the second side wall adjacent to the second edge to provide a covered portion of the second side wall and is not formed on the second side wall beyond adjacent to the second edge to provide an exposed portion of the second side wall that is free of the second selective electroplating mask. A second metal is formed in the second recess and on a portion of the second selective electroplating mask adjacent to the second edge and protrudes beyond the second recess and is not formed on a portion of the second selective electroplating mask on the surface of the second insulating layer spaced-apart from the second edge. The second metal is planarized to expose the second selective electroplating mask on the second edge.

Pursuant to other embodiments according to the invention, there is provided a method for fabricating a metal layer used in a semiconductor device, including the steps of: forming an insulating layer having a concave portion on a semiconductor substrate; forming a selective electroplating mask for exposing a portion of the conductive underlying layer, which is formed at the inside portion of the hole, and for covering at least a portion of the conductive underlying layer, which is formed at the edges of the mouth of the hole; and selectively electroplating the inside of the concave portion that is exposed by the selective electroplating mask.

Preferably, the selective electroplating mask is formed of a nitride or oxide made of aluminum, silicon, tantalum or titanium. Also, preferably, the selective electroplating mask is made by forming a thin layer with aluminum, tantalum or titanium, and oxidizing the thin layer. Preferably, the metal layer is formed of copper (Cu), platinum (Pt), palladium (Pd) or nickel (Ni).

The above method for fabricating a metal layer can further include forming a seed layer, which is used for electroplating the metal layer, below the metal layer. Preferably, the seed layer is formed of copper (Cu), tungsten (W), platinum (Pt) or gold (Au).

The above method for fabricating a metal layer can further include forming a barrier metal layer below the metal layer.

Pursuant to other method embodiments according to the invention, a metal layer can be formed in a semiconductor device by forming an insulating layer having a hole and a trench on a semiconductor substrate; forming a conductive underlying layer on the insulating layer; forming a selective electroplating mask for exposing a portion of the conductive underlying layer, which is formed at the inside portion of the hole, and for covering at least a portion of the conductive underlying layer, which is formed at the edges of the mouth of the hole; forming a first metal layer by selectively electroplating a metal layer at the inside portion of the hole, which is exposed by the selective electroplating mask; and forming a second metal layer to fill the trench on the first metal layer.

Pursuant to other method embodiments according to the invention, a metal layer can be formed in a semiconductor device by forming a first insulating layer having a hole on the first insulating layer; forming a conductive underlying layer on the first insulating layer; forming a selective electroplating mask for exposing a portion of the conductive underlying layer, which is formed at the inside portion of the hole, and for covering at least a portion of the conductive underlying layer, which is formed at the edges of the mouth of the hole; forming a first metal layer to fill the hole by selectively electroplating a metal layer at the inner portion of the hole that is exposed by the selective electroplating mask; forming a second insulating layer having at least a trench, which exposes the first metal layer, on the first insulating layer; and forming a second metal layer to fill the trench.

Pursuant to other method embodiments according to the invention, a metal layer can be formed in a semiconductor device by forming a first insulating layer having a hole on a semiconductor substrate; forming a first metal layer to fill the hole; forming a second insulating layer having at least a trench, which exposes the first metal layer, on the first insulating layer; forming a conductive underlying layer on the second insulating layer; forming a selective electroplating mask for exposing a portion of the conductive underlying layer, which is formed at the inside portion of the hole, and for covering at least a portion of the conductive underlying layer, which is formed at the edges of the mouth of the hole; and forming a second metal layer to fill the trench by selectively electroplating a metal layer only in the trench, which is exposed by the selective electroplating mask.

The above method can further includes the steps of forming a second conductive underlying layer on the first insulating layer; forming a selective electroplating mask for exposing a portion of the conductive underlying layer, which is formed at the inside portion of the hole, and for covering a portion of the conductive underlying layer, which is formed at the edges of the mouth of the hole; and forming a first metal layer by selectively electroplating a metal layer only in the hole exposed by the second selective electroplating mask.

The above method may further include planarizing the second metal layer until the upper portion of the second insulating layer is exposed.

With a method for fabricating a metal layer used in a semiconductor device by electroplating, according to the present invention, it is possible to effectively suppress the occurrence of void in the metal layer.

DETAILED DESCRIPTION OF EMBODIMENTS ACCORDING TO THE INVENTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the relative sizes of regions may be exaggerated for clarity. It will be understood that when an element such as a layer, region, portion, or substrate is referred to as being "on" another element, it can be directly on the other element or intervening elements may also be present. In contrast, when an element is referred to as being "directly on" another element, there are no intervening elements present. The terms used herein are to be given their ordinary meaning unless explicitly defined otherwise herein.

Hereinafter, method embodiments of forming a metal layer using electroplating will be described with reference to FIGS. 2 through 8. In some embodiments according to the invention, the metal layer is Cu. In other embodiments according to the invention, the metal layer can be other materials that can be deposited by electroplating, such as platinum (Pt), palladium (Pd) or nickel (Ni).

Figure 2:
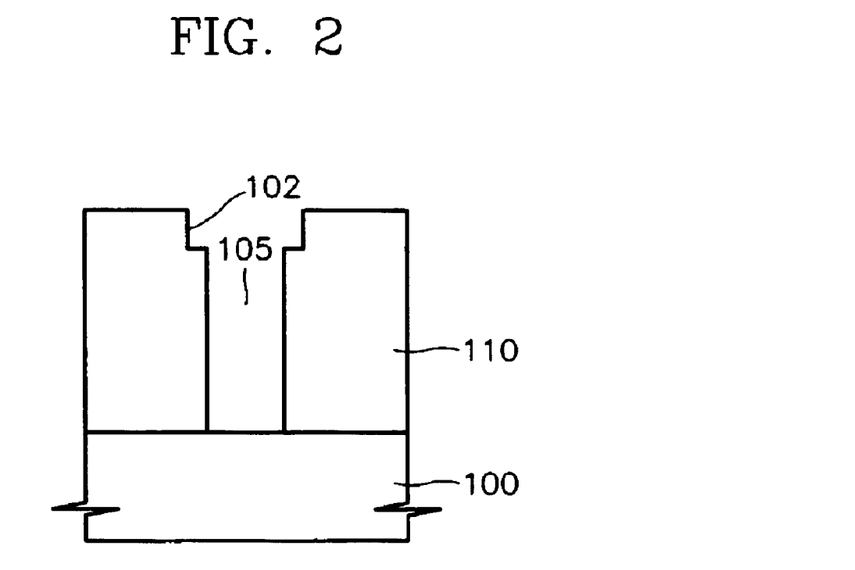
FIGS. 2 through 8 are cross-sectional views that illustrate method and device embodiments according to the present invention.

Referring to FIG. 2, an insulating layer 110 is formed on an integrated circuit substrate 100, such as a semiconductor substrate, in an integrated circuit device. The insulating layer 110 may be an interlevel dielectric layer, and an underlying conductive layer (not shown) may be present between the integrated circuit substrate 100 and the insulating layer 110. The underlying conductive layer can be a wiring layer in the integrated circuit device.

The insulating layer 110 is patterned by, for example, by etching to form a trench 102 and a hole 105 to a desired shape. In some embodiments according to the invention, the trench 102 is patterned to have a line shape to provide a wiring line, and the hole 105 is formed to pass through the insulating layer 110 to electrically contact the integrated circuit substrate 100 and/or an underlying conductive layer.

Figure 3:
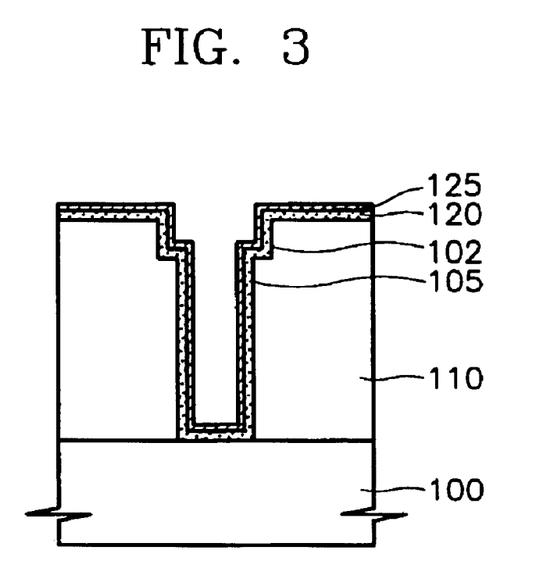

Referring to FIG. 3, a barrier metal layer 120 is formed in the trench 102 and the hole 105 and on the substrate 100. In some embodiments according to the invention, the barrier metal layer 120 is formed of tantalum (Ta), titanium (Ti), tungsten (W), and/or a nitride of one or more of these materials, i.e., a tantalum nitride (TaN), a titanium nitride (TiN) or a tungsten nitride (WN). In some embodiments according to the invention, the barrier metal layer 120 may be a tantalum silicon nitride (Ta—Si—N) or a titanium silicon nitride (Ti—Si—N). In some embodiments according to the invention, the barrier metal layer 120 is formed by Ionized Physical Vapor Deposition (IPVD) or Chemical Vapor Deposition (CVD) to a thickness in a range between about 100 Ångstroms and about 700 Angstroms. The barrier metal layer 120 can prevent a metal layer formed thereon from diffusing into the insulating layer 110.

A seed layer 125 is formed on the barrier metal layer 120. When Cu is to be formed as the metal layer (by electroplating), the seed layer 125 can be Cu. In some embodiments according to the invention, the seed layer 125 is formed of tungsten (W), platinum (Pt) and/or gold (Au). The seed layer 125 can be useful during subsequent electroplating (to form the metal layer) as a path to conduct current during the electroplating. Preferably, the seed layer 125 is formed by the IPVD or CVD to a thickness in a range between about 50 Angstroms and about 2500 Angstroms. In some embodiments according to the invention where the seed layer 125 is not formed, the barrier metal layer 120 can provide the underlying conductive layer.

Figure 4:
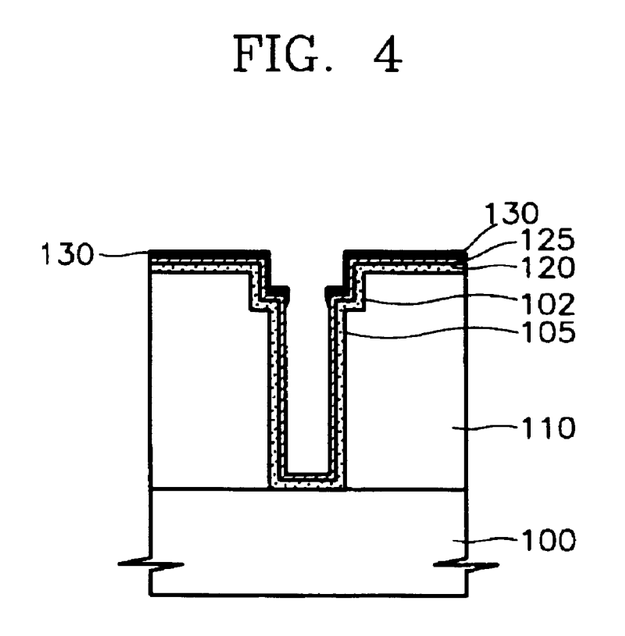

As shown in FIG. 4, a selective electroplating mask 130 is formed on the edges mouth of the hole 105 and the outside the mouth of the hole 105 and not on the side wall and bottom of the hole 105. In other words, the selective electroplating mask 130 is formed on the side wall adjacent to the edge of the hole 105 and not on the side wall beyond adjacent to the hole 105 to provide an exposed portion.

The portion of the seed layer 125 on which the selective electroplating mask 130 is formed is not electroplated during the subsequent electroplating process, thereby preventing the deposition of a metal layer on the seed layer 125 which is covered by the selective electroplating mask 130. In some embodiments according to the invention, the selective electroplating mask 130 is formed of an insulating material such as a nitride or oxide made of aluminum, silicon, tantalum and/or titanium. In some embodiments according to the invention, the selective electroplating mask 130 is formed to a thickness in a range between about 50 Angstroms and about 500 Angstroms, and preferably, to a thickness in a range between about 50 Angstroms and about 100 Angstroms.

As discussed above, the inside of the hole 105, i.e., the side wall and the bottom of the hole 105, is not covered with the selective electroplating mask 130. To secure the deposition characteristics of the selective electroplating mask 130, this layer may be formed to have poor step coverage. For example, a thin layer, such as an oxide layer and a nitride layer, may be formed by conventional sputtering or reactive vapor deposition, thereby providing the selective electroplating mask 130. In some embodiments according to the invention, an insulating layer is formed of $SiO_2$, $TiO_2$, $Ta_2O_5$, Sin or AIN or the like by Plasma Enhanced Chemical Vapor Deposition (PECVD). After forming a metal layer of Al, Ti, Si or Ta, the metal layer may be oxidized to form the selective electroplating mask 130.

It will be understood that, in some embodiments according to the invention, techniques other than electroplating, such as sputtering, may be used to deposit the metal in the recess. Accordingly, in such embodiments, a selective deposition mask can be used in place of the selective electroplating mask.

In the case where the hole 105 has a relatively small Critical Dimension (CD) and a high aspect ratio, the insulating layer is not deposited on the side wall and on bottom of the hole 105 and is deposited on the edges of the mouth of the hole 105, since the insulating layer is deposited by the reactive vapor deposition to provide a thin layer that has poor step coverage. Further, when the insulating layer is formed by the PECVD, the insulating layer is not deposited at the inside of a hole having high aspect ratio due to the poor step coverage.

When an aluminum layer is formed, by sputtering, to a thickness of about 50 Ångstroms, and then is naturally oxidized to form the selective electroplating mask 130, the selective electroplating mask 130 covers the portion of the hole adjacent to and outside the mouth of the hole 105 when the hole 105 has a CD in a range between about 0.05 µm and about 0.7 µm and a depth in a range between about 0.2 µm and about 5 µm. Accordingly, the inside of the hole 105 is not covered with the selective electroplating mask 130. Therefore, the seed layer 125 on the side wall and bottom of the hole 105 is left exposed because it is not covered with the selective electroplating mask 130.

Figure 5:
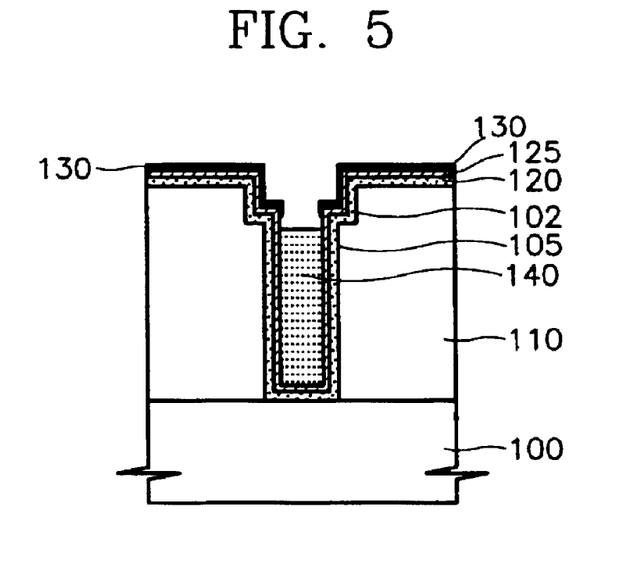

Referring to FIG. 5, a first metal layer 140 is formed on the exposed portion of the seed layer 125 by electroplating. In some embodiments according to the invention, the first metal layer 140 is formed of Cu. Electricity can be applied to the exposed portion of the seed layer 125 to grow the first metal layer 140 on the exposed portion of the seed layer 125. The edges of the mouth of the hole 105 and the portions outside the hole 105 are covered with the selective electroplating mask 130, and therefore, no current flows through the selective electroplating mask 130 during the electroplating, thereby preventing the growth of the first metal layer on the selective electroplating mask 130. Therefore, the first metal layer 140 is selectively grown on the bottom and side wall of the hole 105 by electroplating and is prevented from being grown on the edges of the mouth of the hole 105 and outside the mouth of the hole 105. The growth of the first metal layer 140 is performed by electroplating until the hole 105 is filled with the first metal layer 140, thereby forming a plug.

In conventional methods, a metal layer can grow on the edges of the mouth of the hole faster than on other relatively horizontal portions of the hole which are adjacent to the mouth of the hole, which could cause a void in the metal layer used to fill the hole. However, in embodiments according to the invention, the first metal layer 140 is prevented from being grown on the edges of the mouth of the hole 105 and adjacent to the mouth outside the hole 105 during electroplating, thereby allowing the first metal layer 140 to fill the hole 105 without voids forming therein.

Figure 6:
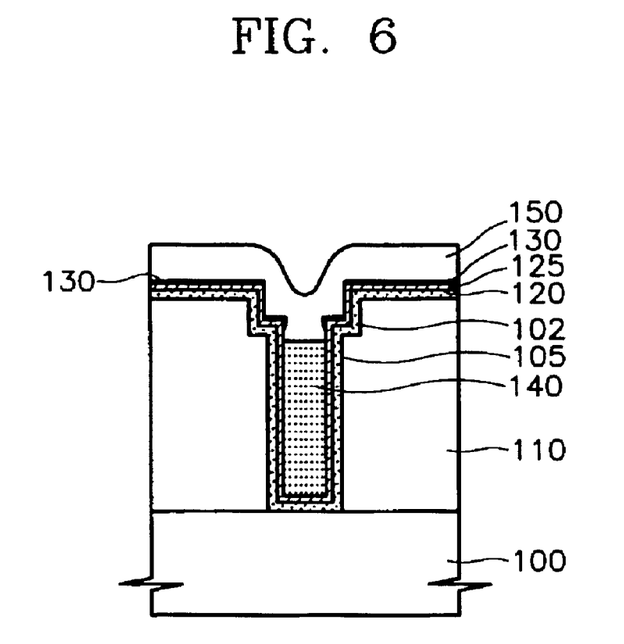

Referring to FIG. 6, the first metal layer 140 can be etched to remove an oxide layer which may have formed on the first metal layer 140, when for example, Cu is used as the first metal layer 140. During the etching of the first metal layer 140, the selective electroplating mask 130 can be partially or completely removed. Thereafter, a second metal layer 150 is formed on the first metal layer 140. In some embodiments according to the present invention, the second metal layer 150 is formed of copper or aluminum. The second metal layer 150 may be deposited using PVD.

Figure 7:
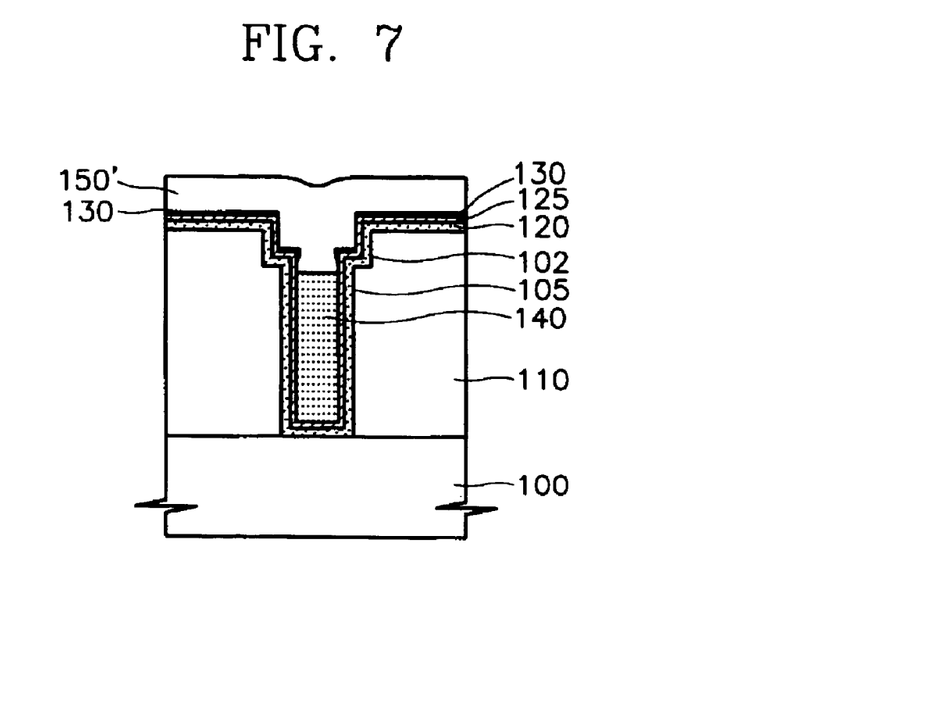

Referring to FIG. 7, the second metal layer 150 is refolded to form a planarized second metal layer 150', such as a planarized copper or aluminum layer.

Figure 8:
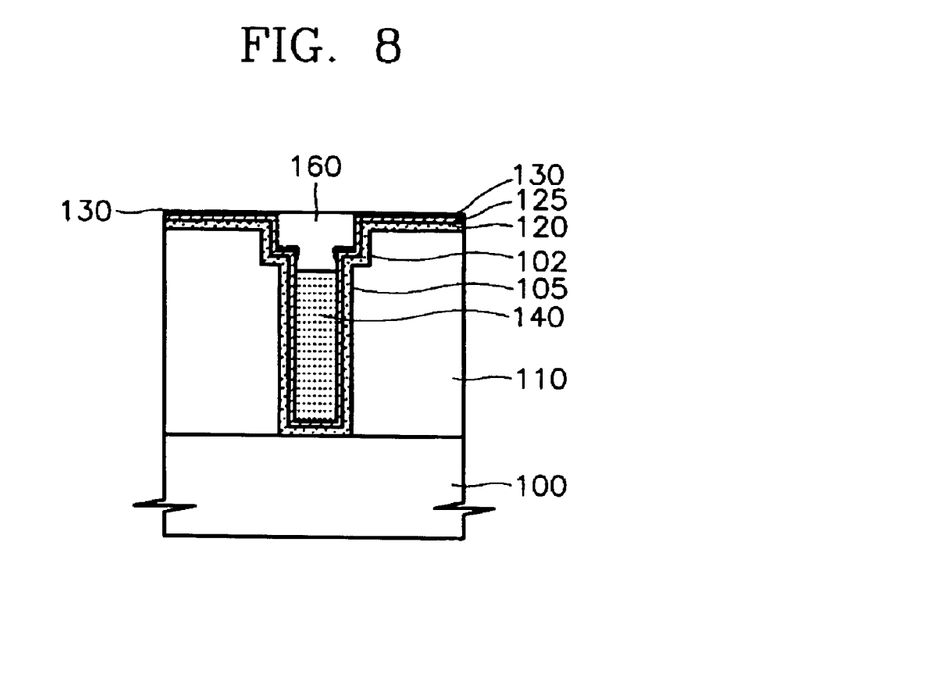

Referring to FIG. 8, Chemical Mechanical Polishing (CMP) or an etch back is performed on the planarized second metal layer 150' in the trench 102 to thereby complete a metal wiring line 160.

As discussed above, in embodiments according to the invention, the selective electroplating mask 130 is formed to selectively cover the edges of the mouth of the hole 105 and outside of the hole 105. The seed layer 125 inside the hole 105, on the side wall and bottom of the hole 105, is exposed. The first metal layer 140 is formed by electroplating the first metal onto the exposed portions of the seed layer 125 in the hole. The edges of the mouth of the hole 105 are covered with the selective electroplating mask 130, and thus, the first metal layer 140 is not locally and excessively deposited there, thereby reducing the likelihood of a void forming in the hole 105.

Embodiments according to the invention involving the formation of a second metal layer will now be described with reference to FIGS. 9–11. Some of the elements described in reference to the embodiments illustrated by FIGS. 9–11 may be the same as the elements described above in reference to the embodiments illustrated in FIGS. 2–8 and, therefore, will be described using the same reference designators.

As described in the embodiments illustrated in FIGS. 2 through 5, an insulating layer 110 is formed on a integrated circuit substrate 100. A predetermined portion of the insulating layer 110 is patterned to form a hole 105 and a trench 102. The barrier metal layer 120 is formed in the hole 105, using for example a tantalum nitride layer (TaN). The seed layer 125, such as a Cu seed layer, is formed on the barrier metal layer 120. Thereafter, a selective electroplating mask 130 is deposited on the seed layer 125 on the edges of the mouth of the hole 105 and outside of the hole 105, and not on inside the hole 105, such as on the side wall and bottom of the hole 105. The seed layer 125 inside the hole 105, not having the selective electroplating mask 130 formed thereon, is selectively electroplated to fill the inside of the hole 105 with the first metal layer 140 to form the plug, e.g., a Cu plug.

Figure 9:
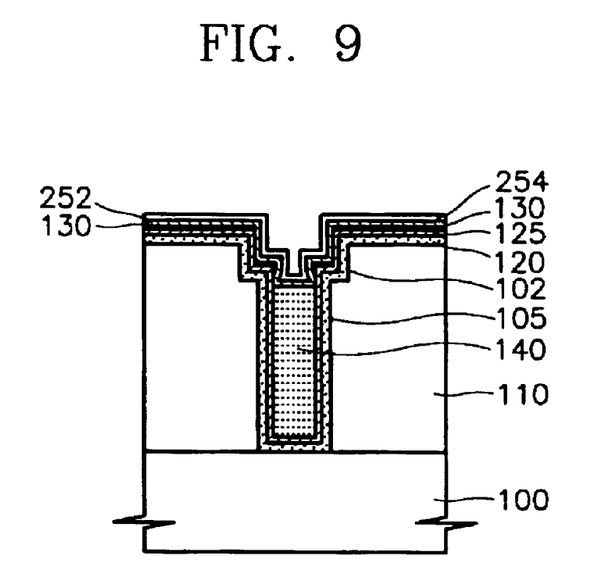
FIGS. 9 through 11 are cross-sectional views that illustrate method and device embodiments according to the present invention.

Referring to FIG. 9, an oxide layer may be formed on the first metal layer 140, due to exposure of the first metal layer 140 to air. The oxide layer can be removed by etching. During the etching of the oxide layer, the selective electroplating mask 130 can be partially or completely removed from the edges of the mouth of the hole 105 and the outside of the hole 105.

A second barrier metal layer 252 is formed on the portion of the first metal layer 140 exposed by the etching. Preferably, the second barrier metal layer 252 is formed to a thickness of about 100 Ångstrom. A second seed layer 254 may be formed on the second barrier metal layer 252. Preferably, the second seed layer 254 is formed by IPVD or CVD to a thickness in a range between about 10 Ångstroms and about 500 Ångstroms. However, the second seed layer 254 can be omitted.

Figure 10:
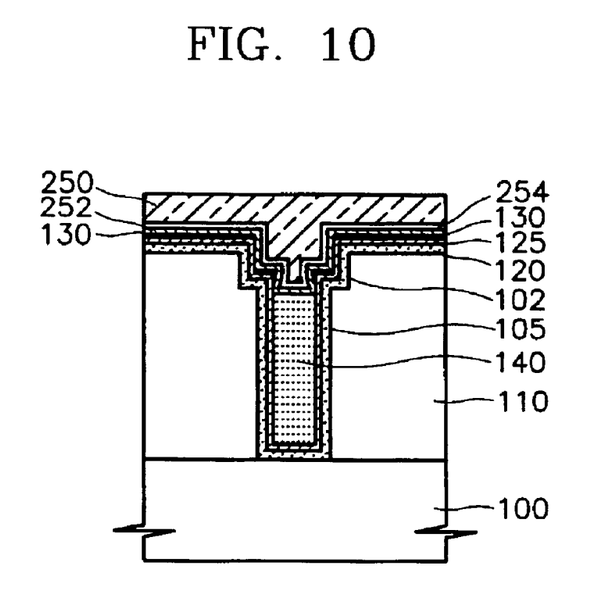
Figure 11:
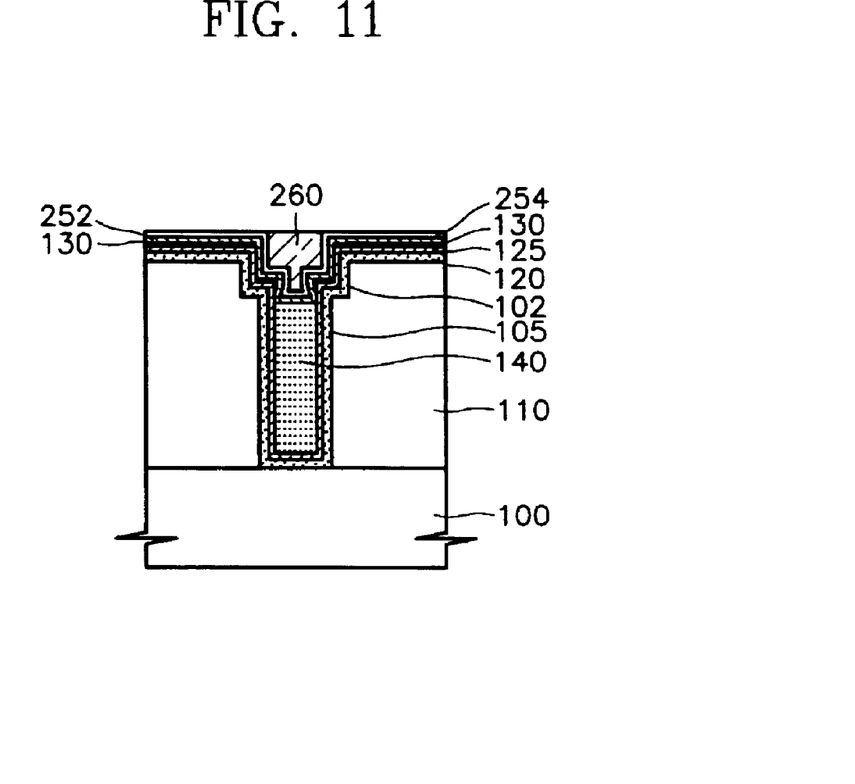

Referring to FIGS. 10 and 1, a second metal layer 250 is formed on the second seed layer 254 by electroplating. The second metal layer 250 can be formed of Cu, Pt, Pd, Ni or other materials that can be deposited by electroplating. Then, CMP or an etch back is performed on the second metal layer 250 to form a metal wiring line 260.

Figure 12:
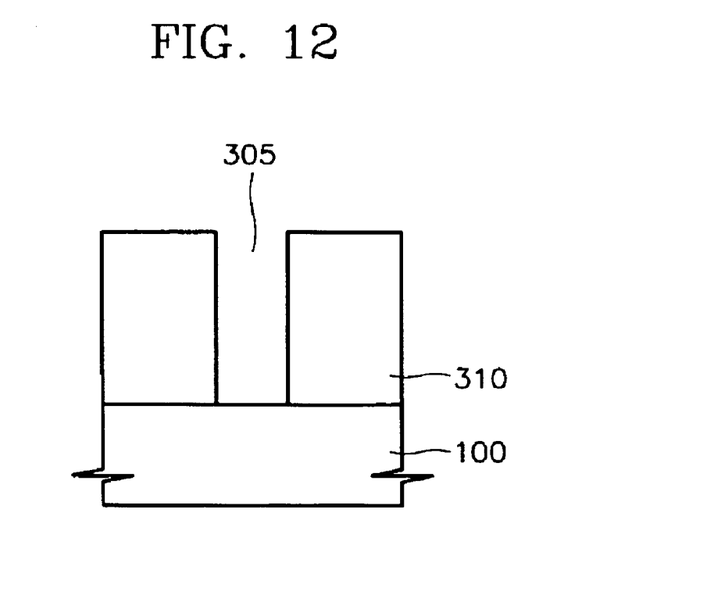
FIGS. 12 through 21 are cross-sectional views that illustrate method and device embodiments according to the present invention.

FIGS. 12 through 21 are cross-sectional views that illustrate embodiments of forming a metal layer in an integrated circuit device according to the invention. Referring to FIG. 12, a first insulating layer 310 is formed on an integrated circuit substrate 100. Here, the first insulating layer 310 can be an interlevel insulating layer that is formed of a silicon oxide material. Further, an underlying conductive layer (not shown) may be present between the integrated circuit substrate 100 and the first insulating layer 310. Such an underlying conductive layer can be a lower wiring layer of the integrated circuit device. The first insulating layer 310 is patterned by etching to form a hole 305. The hole 305 extends through the first insulating layer 310 to expose the integrated circuit substrate 100.

Figure 13:
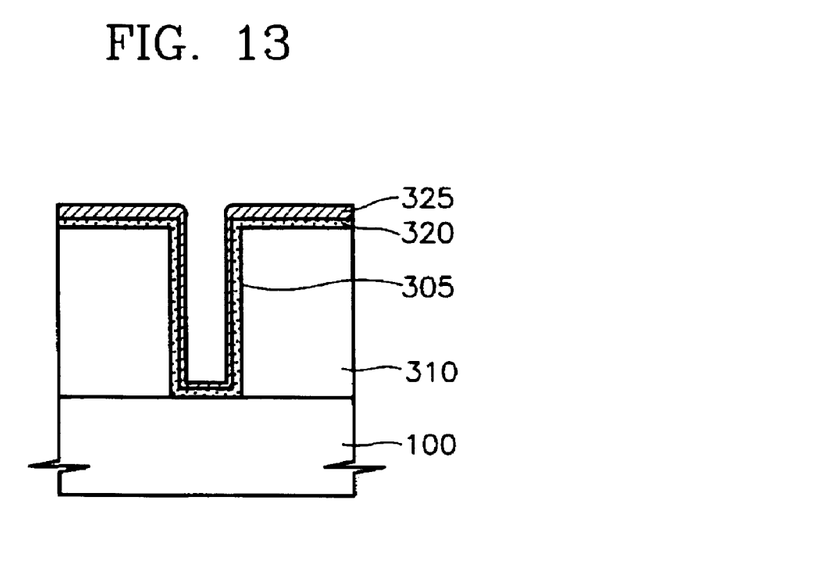

Referring to FIG. 13, a first barrier metal layer 320 is formed on the resultant structure and in the hole 305. In some embodiments according to the invention, the first barrier metal layer 320 is formed of tantalum (Ta), titanium (Ti) or tungsten (W) or a nitride formed of one of the above materials, such as a tantalum nitride (TaN) layer, a titanium nitride (TiN) or a tungsten nitride (WN). In other embodiments according to the invention, a tantalum silicon nitride (Ta—Si—N) or a titanium silicon nitride (Ti—Si—N) may be used as the first barrier metal layer 320. The first barrier metal layer 320 may be formed to a thickness in a range between about 70 Ångstroms and about 100 Ångstroms using IPVD or CVD. The first barrier metal layer 320 can help prevent diffusion from the insulating layer 310 into other metal layers.

A first seed layer 325 is formed on the first barrier metal layer 320. If a Cu layer is to be used as the second metal layer, the first seed layer 325 can be Cu. In other embodiments according to the invention, the first seed layer 325 can be formed of tungsten (W), platinum (Pt) gold (Au) or the like. Preferably, the first seed layer 325 is formed by the IPVD or the CVD to a thickness in a range between about 50 Ångstroms and about 2500 Ångstroms.

Figure 14:
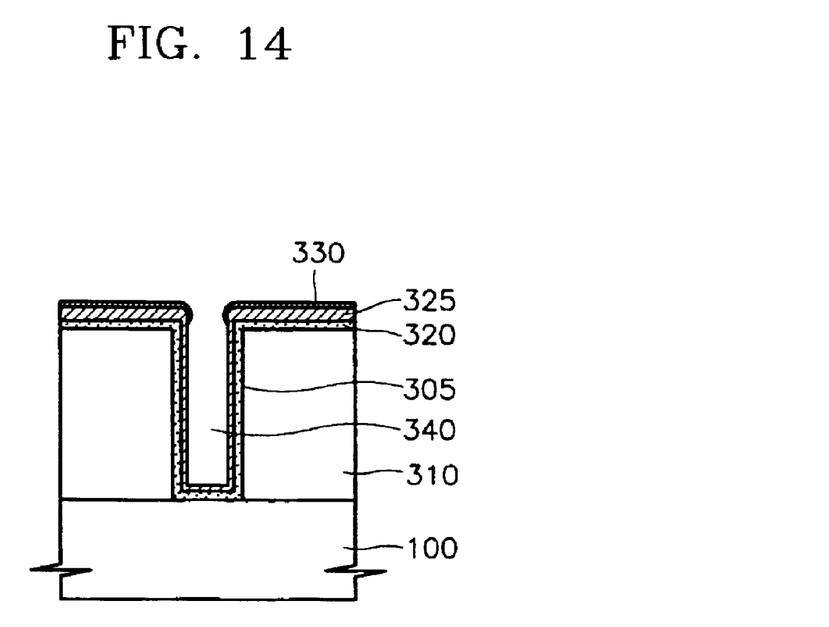

Referring to FIG. 14, a first selective electroplating mask 330 is formed on the first seed layer 325 and on the edges of the mouth of the hole 305 and outside the hole 305, and not inside the hole 305 such as on the side wall below the mouth of the hole 305 and on the bottom of the hole 305. The first selective electroplating mask 330 on the edges of the mouth of the hole 305 and outside of the hole 305 prevent the deposition of a metal layer thereon during electroplating. The first selective electroplating mask 330 can be formed of an insulating material, such as a nitride formed of one of aluminum, silicon, tantalum or titanium, to a thickness in a range between about 10 Ångstroms and about 500 Ångstroms. Preferably, the first selective electroplating mask 330 is formed to a thickness in a range between about 50 Ångstroms and about 100 Ångstroms.

Figure 15:
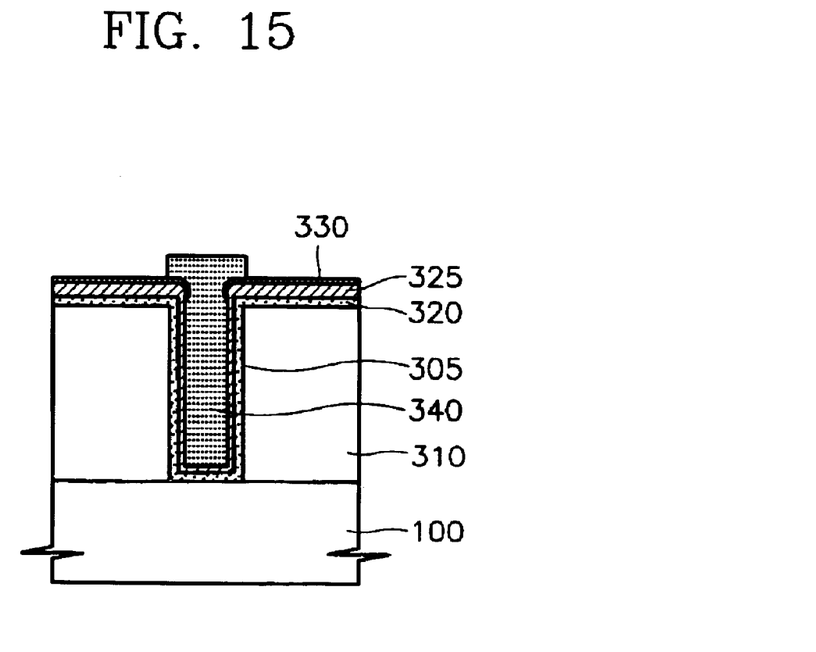

Referring to FIG. 15, a first metal layer 340, such as a Cu layer, is formed on the exposed portion of the seed layer 325 by electroplating. The first metal layer 340 can be selectively grown on the exposed portion of the seed layer 325 by applying an electric current therethrough during the electroplating.

Therefore, first metal layer is prevented from growing on the edges of the mouth of the hole 305. In general, it is known that the growth of a metal layer is faster at the edges of the mouth of a hole than at other relatively horizontal portions thereof when the metal layer is electroplated. Such a phenomenon is sometimes referred to as "pinch off." Due to the "pinch off," voids can occurs in the metal layer. However, in embodiments according to the invention, a metal layer is prevented from being grown at the edges of the mouth of the hole 305 when it is electroplated. Therefore, the inside of the hole 305 can be filled with the first metal layer 340, while suppressing the occurrence of voids therein.

The first metal layer 340 is grown by electroplating until the hole 305 is filled with the first metal layer 340, thus forming a first metal layer pattern, i.e., a plug. Relatively little or none of the first metal layer 340 is deposited on the upper surface of the first insulating layer 310 is covered with the first selective electroplating mask 330 and thus is hardly deposited with. Therefore, the first metal layer 340 is grown only in the hole 305.

Figure 16:
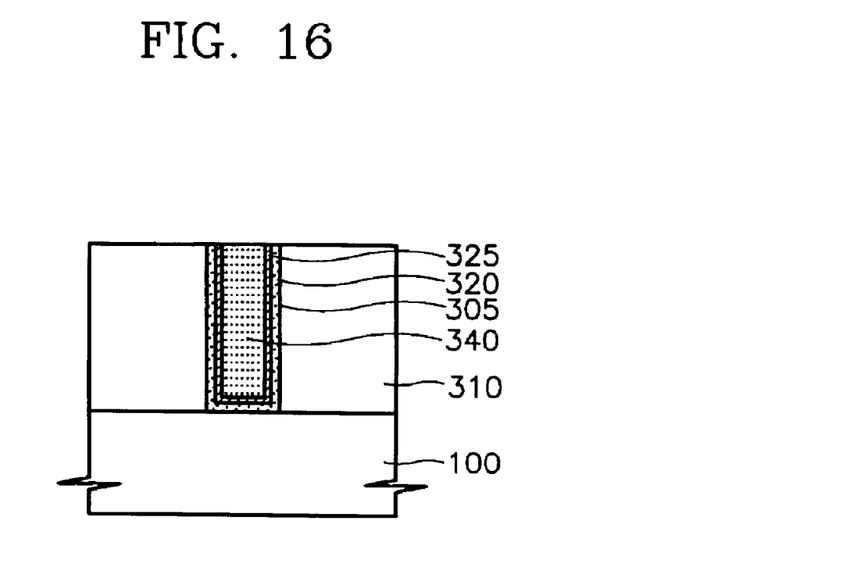

Referring to FIG. 16, the first metal layer 340 is planarized until the upper surface of the first insulating layer 310 is exposed. The planarization of the first metal layer 340 may be performed by CMP or etch back. The first metal layer 340 protrudes from the hole 305, and is not grown on the first insulating layer 310. Therefore, it is possible to reduce a portion of the first metal layer 340 to be planarized by the CMP. As a result, the first metal layer 340 is deposited only in the hole 305, thereby conforming to a plug shape.

Figure 17:
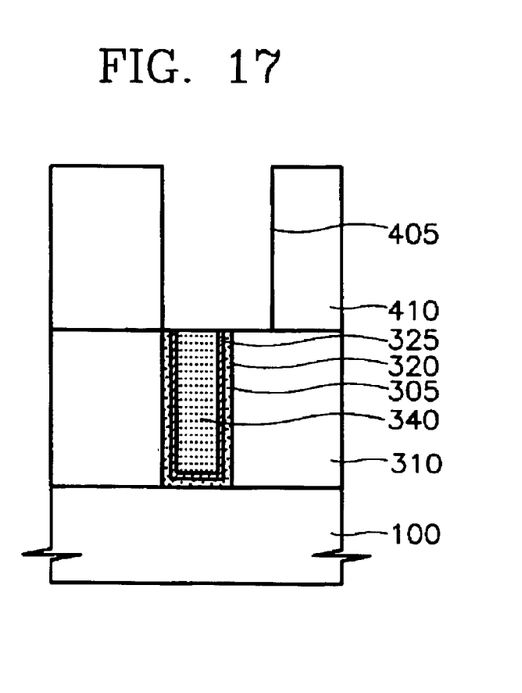

Referring to FIG. 17, an etch stopper (not shown) is formed to cover the first insulating layer 310. A second insulating layer 410 is formed on the etch stopper. The second insulating 410 is patterned to form a trench 405 that is aligned with respect to the hole 305. The trench 405 may be patterned in the form of a wiring line. The patterning of the trench 405 is performed until the etch stopper 410 is removed to expose the upper surface of the first metal layer 340 through the trench 405.

Figure 18:
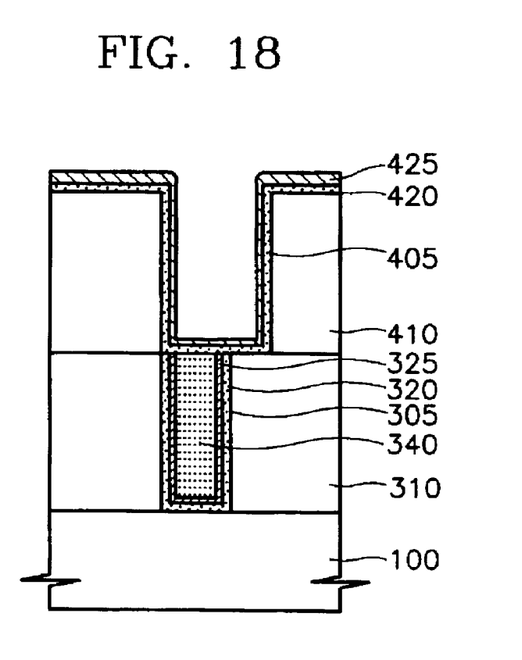

Referring to FIG. 18, a second barrier metal layer 420 is formed on the resultant structure including in the trench 405. The second barrier metal layer 420 may be formed of tantalum (Ta), titanium (Ti), tungsten (W) or a nitride formed of one of these materials, e.g., a tantalum nitride (TaN), a titanium nitride (TiN) or a tungsten nitride (WN). In other embodiments according to the invention, the second barrier metal layer 420 may be a tantalum silicon nitride (Ta—Si—N) or a titanium nitride (Ti—Si—N). Preferably, the second barrier metal layer 420 is formed by IPVD or CVD to a thickness in a range between about 100 Ångstroms and about 700 Ångstroms. The second barrier metal layer 420 can prevent the diffusion of the second insulating layer 410 into the hole 405.

A second seed layer 425 is formed on the second barrier metal layer 420. When a Cu layer is to be deposited by electroplating, the second seed layer 425 may be a Cu seed layer. In other embodiments according to the invention, the second seed layer 425 can be formed of tungsten (W), platinum (Pt), gold (Au), or the like. Preferably, the second seed layer 425 is formed by IPVD or CVD to a thickness of in a range between about 50 Ångstroms and about 2500 Ångstroms.

Figure 19:
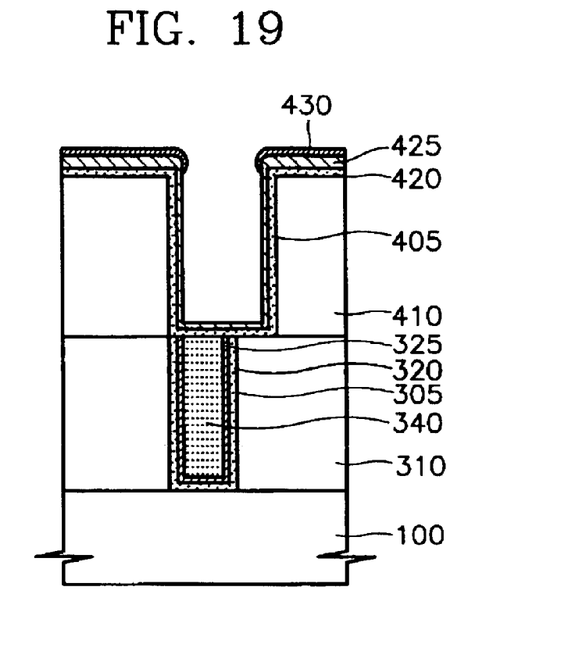

Referring to FIG. 19, a second selective electroplating mask 425 is formed on the second seed layer 425 at the edges of the mouth of trench 405 and outside the trench 405, and not inside the trench 405, such as on the side wall of the trench 405 and on the bottom of the trench 405. The second selective electroplating mask 430 suppresses the deposition of a metal layer on the portions of the second seed layer 425 having the second selective electroplating mask 430 formed thereon. The second selective electroplating mask 430 may be formed of an insulating material, such as aluminum, silicon, tantalum or titanium, or a nitride or oxide formed of one of these materials. The second selective electroplating mask 430 may be formed to a thickness in a range between about 10 Ångstroms and about 500 Ångstroms, and preferably to a thickness in a range between about 50 Ångstroms and about 100 Ångstroms.

As a result, the predetermined portion of the second seed layer 425 formed inside the trench 405, i.e., on its side wall and the bottom, is not deposited with a metal layer due to the second selective electroplating mask 430 formed thereon.

Figure 20:
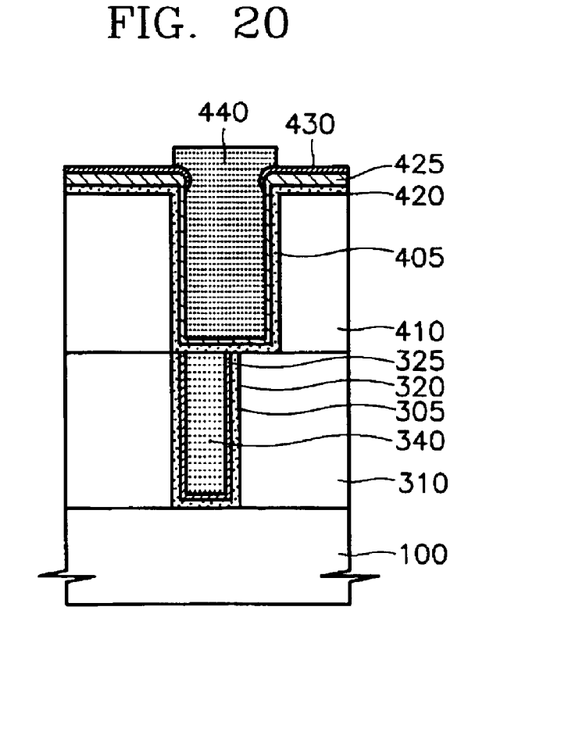

Referring to FIG. 20, a second metal layer 440, such as a Cu layer, is formed on the exposed portion of the second seed layer 425 by electroplating. Only the exposed portion of the second seed layer 425 is provided with an electric current, and thus, the second metal layer 440 is selectively grown on the exposed portions of the second seed layer 425.

Therefore, the second metal layer 440 is not deposited on the edges of the mouth of the trench 405. In general, it is known that the growth of a metal layer can be electroplated faster on the edges of the mouth of a trench than on other relatively horizontal portions thereof which is sometimes referred to as "pinch off." Due to "pinch off," voids can occurs in the second metal layer 440. However, in embodiments according to the invention, the second metal layer 440 is prevented from being grown at the edges of the mouth of the hole 405 when it is electroplated. Therefore, the inside of the trench 405 can be filled with the second metal layer 440, thereby suppressing the occurrence of voids therein.

The second metal layer 440 is grown by electroplating until the trench 405 is completely filled with the second metal layer 440, thus forming a second metal layer pattern. The upper surface of the second insulating layer 410 is covered with the second selective electroplating mask 430, thereby preventing the deposition of the second metal layer 440 thereon. Therefore, the second metal layer 440 is selectively grown to protrude from the trench 405.

Figure 21:
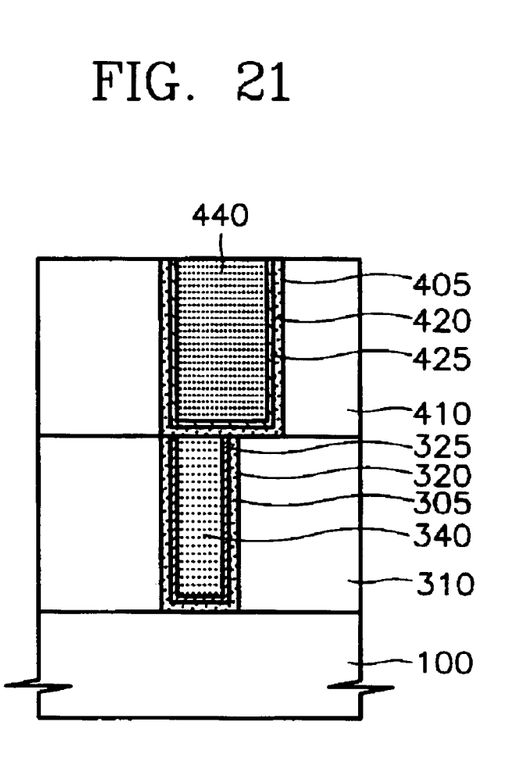

Referring to FIG. 21, the second metal layer 440 is planarized until the upper surface of the second insulating layer 410 is exposed. The planarization of the second metal layer 440 may be performed by CMP or etch back. At this time, the second metal layer 440 protrudes only on the trench 405, that is, it is not grown at the upper surface of the second insulating layer 410, thereby greatly reducing a portion of the second metal layer 440 by CMP. Accordingly, the second metal layer 440 is filled only in the trench 405, thus being a metal wiring.

As discussed above, a metal layer is formed in a hole or a trench using electroplating. A selective electroplating mask is deposited on the edges of the mouth of the hole or trench (or other concave portion) and outside the hole, thereby selectively growing the metal layer in the trench and not on the edges of the mouth of the hole or trench during the electroplating. As a result, the metal layer can be prevented from being deposited at the edges of the mouth of the hole or trench. Therefore, it is possible to prevent rapid growth of the metal layer on the edges of the mouth of the hole. Further, the electrical characteristics and reliability of the metal layer can be improved.

It should be noted that many variations and modifications can be made to the embodiments described above without substantially departing from the principles of the present invention. All such variations and modifications are intended to be included herein within the scope of the present invention, as set forth in the following claims.

What is claimed:

1. A method of forming a metal layer in an integrated circuit device, the method comprising:
   forming a recess in a surface of an insulating layer, the recess having a side wall inside the recess, a bottom inside the recess, and an edge at a boundary of the surface of the insulating layer and the side wall;
   forming a selective electroplating mask on the side wall to provide a covered portion of the side wall and to provide an exposed portion of the side wall that is free of the selective electroplating mask; and
   electroplating a metal on the exposed portion of the side wall.

2. A method according to claim 1 wherein forming a selective electroplating mask comprises forming the selective electroplating mask on the surface adjacent to the edge and on the side wall adjacent to the edge and not on the side wall beyond adjacent to the edge.

3. A method according to claim 1 wherein electroplating comprises electroplating the mental on the exposed portion of the side wall and on the bottom to fill the recess with the metal to beneath a level of the electroplating mask on the side wall.

4. A method according to claim 1 wherein forming a recess further comprises forming the recess to a depth that is about at least three times as great as a width of the recess.

5. A method according to claim 4 wherein the width is in a range between about 0.05 µm and about 0.7 µm and the depth is in a range between about 0.2 µm and about 5 µm.

6. A method according to claim 4 wherein forming a selective electroplating mask comprises forming an oxide layer on the insulating layer and the recess using sputtering or reactive vapor deposition.

7. A method according to claim 6 wherein forming an oxide layer comprises forming the oxide layer to a thickness in a range between about 10 Ångstroms and about 500 Ångstroms.

8. A method according to claim 4 wherein the insulating layer comprises a first insulating layer, wherein forming a selective electroplating mask comprises forming a second insulating layer on the first insulating layer and on the recess using plasma enhanced chemical vapor deposition.

9. A method according to claim 4 wherein forming a selective electroplating mask comprises:
   forming a metal layer on the first insulating layer and on the recess; and
   oxidizing the metal layer.

10. A method according to claim 1 wherein forming a recess is followed by:
    forming a trench in the surface of the insulating layer on the recess that is wider than the recess, wherein the trench exposes the edge of the recess.

11. A method according to claim 1 wherein the metal comprises a first metal, the method further comprising:
    forming a second metal on the first metal.

12. A method according to claim 1 wherein the metal comprises copper.

13. A method according to claim 1 further comprising:
    avoiding forming the selective electroplating mask on the covered portion of the side wall.

14. A method for fabricating a metal layer in a semiconductor device, the method comprising:
    forming an insulating layer having a concave portion an a semiconductor substrate;
    forming a selective electroplating mask for exposing a portion of the conductive underlying layer, which is formed at an inside portion of the hole, and for covering at least a portion of the conductive underlying layer, which is formed at the edges of the mouth of the hole; and
    selectively electroplating the inside of the concave portion that in exposed by the selective electroplating mask.

15. The method of claim 14, wherein the selective electroplating mask is formed of an insulating material.

16. The method of claim 15, wherein the selective electroplating mask is formed of a nitride or oxide made of aluminum, silicon, tantalum or titanium.

17. The method of claim 14, wherein forming the selective electroplating mask comprises:
    forming a thin layer with aluminum, tantalum or titanium; and
    oxidizing the thin layer.

18. The method of claim 14, wherein the metal layer is formed of copper (Cu), platinum (Pt), palladium (Pd) or nickel (Ni).

19. The method of claim 14 further comprises forming a seed layer, which is used for electroplating the metal layer, below the metal layer.

20. The method of claim 19, wherein the seed layer is formed of copper (Cu), tungsten (W), platinum (Pt) or gold (Au).

21. The method of claim 14, wherein a barrier metal layer is formed below the metal layer.

22. A method of forming a metal layer in an integrated circuit device, the method comprising:
    forming a recess in a surface of an insulating layer, the recess having a side wall inside the recess, a bottom inside the recess, and an edge at a boundary of the surface of the insulating layer and the side wall;
    forming a selective deposition mask on the side wall to provide a covered portion of the side wall and to provide an exposed portion of the side wall that is free of the selective deposition mask; and
    depositing a metal on the exposed portion of the side wall.

23. A method according to claim 22 wherein the depositing comprises sputtering the metal on the exposed portion of the side wall.

24. A method according to claim 22 wherein the depositing comprises electroplating the metal on the exposed portion of the side wall.

* * * * *

UNITED STATES PATENT AND TRADEMARK OFFICE
CERTIFICATE OF CORRECTION

PATENT NO. : 6,787,460 B2
DATED : September 7, 2004
INVENTOR(S) : Lee et al.

It is certified that error appears in the above-identified patent and that said Letters Patent is hereby corrected as shown below:

Column 12,
Line 19, should read -- forming an insulating layer having a concave portion on --.

Signed and Sealed this

Nineteenth Day of April, 2005

JON W. DUDAS
*Director of the United States Patent and Trademark Office*